(12) United States Patent
Gu

(10) Patent No.: US 12,494,751 B2
(45) Date of Patent: Dec. 9, 2025

(54) BIAS CIRCUIT AND POWER AMPLIFIER

(71) Applicant: Shanghai WUQI Microelectronics Co., Ltd., Shanghai (CN)

(72) Inventor: Qiang Gu, Shanghai (CN)

(73) Assignee: Shanghai WUQI Microelectronics Co., Ltd., Shanghai (CN)

( * ) Notice: Subject to any disclaimer, the term of this patent is extended or adjusted under 35 U.S.C. 154(b) by 442 days.

(21) Appl. No.: 18/109,876

(22) Filed: Feb. 15, 2023

(65) Prior Publication Data
US 2024/0136985 A1   Apr. 25, 2024
US 2024/0235498 A9   Jul. 11, 2024

(30) Foreign Application Priority Data

Oct. 25, 2022   (CN) .......................... 202211312882.6

(51) Int. Cl.
*H03F 3/45*   (2006.01)
*H03F 3/213*   (2006.01)

(52) U.S. Cl.
CPC ......... *H03F 3/213* (2013.01); *H03F 3/45179* (2013.01); *H03F 2200/21* (2013.01)

(58) Field of Classification Search
CPC .. H03F 3/213; H03F 3/45179; H03F 2200/21; H03F 1/301; H03F 2200/61; H03F 2203/45422; H03F 1/223; H03F 3/45242; H03F 2200/153; H03F 2203/45424; H03F 2203/45674; H03F 2203/45731; H03F 1/086; H03F 3/45183; H03F 3/45188; H03F 3/45632; H03F 3/45654; H03F 2200/453; H03F 1/42; H03F 3/193; H03F 3/211; H03F 2200/36; H03F 2200/451
USPC ................................ 330/253, 254, 258, 261
See application file for complete search history.

(56) References Cited

U.S. PATENT DOCUMENTS

2008/0218265 A1\* 9/2008 Murden .............. H03F 3/45242
                                              330/253

\* cited by examiner

*Primary Examiner* — Andrea Lindgren Baltzell
*Assistant Examiner* — Khiem D Nguyen
(74) *Attorney, Agent, or Firm* — IPRTOP LLC

(57) ABSTRACT

Bias circuits for CMOS power amplifiers are provided. The bias circuit includes a feedback module, a first bias module, and a second bias module. The feedback module has a first input connected to a output common mode voltage, a second input connected to a reference voltage, and an output connected to gates of main amplification transistors in a first differential amplification module; based on a difference between the output common mode voltage and the reference voltage, the feedback module adjusts gate voltages of main amplification transistors until the output common mode voltage is equal to the reference voltage; the first bias module provides bias voltages for the first differential amplification module; the second bias module provides bias voltages for a second differential amplification module. The present disclosure adopts direct negative feedback and cascoded current mirrors, which realize accurate DC gate bias and accurate control of the output common mode voltage.

15 Claims, 5 Drawing Sheets

BIAS CIRCUIT AND POWER AMPLIFIER

CROSS REFERENCE TO RELATED APPLICATION

This application claims the benefits of priority to Chinese Patent Application No. CN 2022113128826, entitled "Bias Circuit and Power Amplifier", filed with CNIPA on Oct. 25, 2022, the content of which is incorporated herein by reference in its entirety.

FIELD OF TECHNOLOGY

The present disclosure relates to integrated circuit design, and more specifically, to a bias circuit and a power amplifier.

BACKGROUND

It is technically challenging to integrate radio-frequency (RF) power amplifiers with high efficiency, high power, and high linearity into common complementary-metal-oxide semiconductor (CMOS) processes. A high effective output power necessitates a high supply voltage (for example, an output power of about 1 watt will require a corresponding supply voltage of 3 to 3.5 volts), but a single common CMOS transistor usually cannot withstand such a high supply voltage in nanometer technique. One traditional solution is to have several MOS transistors stacked together to share the high supply voltage; however, as the number of stacked transistors increases, gate direct-current (DC) bias of the transistors will have a critical impact on the performance of the corresponding power amplifier; for example, a low bandwidth of a DC bias circuit will lead to memory effects in the power amplifier, thus deteriorating linearity of the power amplifier. Admittedly, power amplifiers with complementarily stacked NMOS transistors and PMOS transistors can achieve high power efficiency and high linearity, but they impose demanding requirements on DC gate bias of the transistors: a sufficiently large bandwidth is a must, and precise control of a common mode DC voltage of the power amplifier is also needed.

Therefore, how to design gate bias circuits of power amplifiers with stacked CMOS transistors to ensure that no parasitic oscillation is generated, high reliability is generated, and the performance of the power amplifiers will be balanced, has become an urgent problem facing technical persons in the field.

It should be noted that the above description of the background is set forth only to facilitate a clear and complete description of the technical solutions of the present disclosure and to facilitate the understanding of those skilled in the art. It should not be assumed that the above technical solutions are known to those skilled in the art simply because they are set forth in the Background section of the present disclosure.

SUMMARY

The present disclosure provides a bias circuit and a power amplifier, for solving problems in the related art such as low bandwidths and large errors of common mode DC voltages of power amplifiers with stacked CMOS transistors, caused by inappropriate gate bias designs.

The present disclosure provides a bias circuit, for providing a plurality of bias voltages for an amplification circuit, the amplification circuit includes a first differential amplification module and a second differential amplification module, and the first differential amplification module and the second differential amplification module are complementarily stacked.

The bias circuit includes: a feedback module, a first bias module including a plurality of transistors, and a second bias module including a plurality of transistors; a first input of the feedback module is connected to an output of the amplification circuit to receive an output common mode voltage, a second input of the feedback module is connected to a reference voltage, and outputs of the feedback module are connected to gates of main amplification transistors in the first differential amplification module; based on a difference between the output common mode voltage and the reference voltage, the feedback module adjusts gate voltages at the gates of the main amplification transistors in the first differential implication module until the output common mode voltage is equal to the reference voltage; the first bias module provides a corresponding bias voltage for each transistor in the first differential amplification module other than the main amplification transistors; the second bias module provides a corresponding bias voltage for each transistor in the second differential amplification module.

Each transistor in the first differential amplification module is an N-type metal-oxide-semiconductor (NMOS) transistor, and each transistor in the second differential amplification module is a P-type metal-oxide-semiconductor (PMOS) transistor; or each transistor in the first differential amplification module is a PMOS transistor, and each transistor in the second differential amplification module is an NMOS transistor.

In an embodiment of the present disclosure, the feedback module includes an operational amplifier, a first resistor, and a second resistor; wherein a non-inverting input of the operational amplifier is connected to the output of the amplification circuit to receive the output common mode voltage, an inverting input of the operational amplifier is connected to the reference voltage, an output of the operational amplifier is connected to a gate of a first main amplification transistor in the first differential amplification module through the first resistor, and the output of the operational amplifier is connected to a gate of a second main amplification transistor in the first differential amplification module through the second resistor.

In an embodiment of the present disclosure, the operational amplifier includes an operational amplification unit and a frequency compensation unit; the operational amplification unit amplifies the difference between the output common mode voltage and the reference voltage; the frequency compensation unit is connected to an output of the operational amplification unit, and is for frequency compensation.

In an embodiment of the present disclosure, the operational amplification unit includes a first current source, a first PMOS transistor, a second PMOS transistor, a first NMOS transistor, a second NMOS transistor, a third resistor, and a fourth resistor; the first PMOS transistor and the second PMOS transistor form a pair of differential-input transistors, sources of the first PMOS transistor and the second PMOS transistor are connected to the first current source, a gate of the first PMOS transistor is connected to the non-inverting input of the operational amplification unit, and a gate of the second PMOS transistor is connected to the inverting input of the operational amplification unit; a drain of the first NMOS transistor is connected to a drain of the first PMOS transistor, a gate of the first NMOS transistor is connected to the drain of the first NMOS transistor through the third resistor, and a source of the first NMOS transistor is grounded; a drain of the second NMOS transistor is connected to a drain of the second PMOS transistor and the output of the operational amplification unit, a gate of the second NMOS transistor is connected to the drain of the first NMOS transistor through the fourth resistor, and a source of the second NMOS transistor is grounded.

In an embodiment of the present disclosure, the operational amplification unit includes a second current source, a third PMOS transistor, a fourth PMOS transistor, a fifth PMOS transistor, a sixth PMOS transistor, a third NMOS transistor, a fourth NMOS transistor, a fifth NMOS transistor, a sixth NMOS transistor, a fifth resistor, and a sixth resistor; the third PMOS transistor and the fourth PMOS transistor form a pair of differential-input transistors, sources of the third PMOS transistor and the fourth PMOS transistor are connected to the second current source, a gate of the third PMOS transistor is connected to the non-inverting input of the operational amplification unit, and a gate of the fourth PMOS transistor is connected to the inverting input of the operational amplification unit; a source of the fifth PMOS transistor is connected to a drain of the third PMOS transistor, a drain of the fifth PMOS transistor is connected to a drain of the third NMOS transistor, a source of the sixth PMOS transistor is connected to a drain of the fourth PMOS transistor, a drain of the sixth PMOS transistor is connected to a drain of the fourth NMOS transistor and the output of the operational amplification unit, and a gate of the fifth PMOS transistor and a gate of the sixth PMOS transistor are connected to a first bias voltage; a source of the third NMOS transistor is connected to a drain of the fifth NMOS transistor, a source of the fourth NMOS transistor is connected to a drain of the sixth NMOS transistor, and a gate of the third NMOS transistor and a gate of the fourth NMOS transistor are connected to a second bias voltage; a gate of the fifth NMOS transistor is connected to the drain of the third NMOS transistor through the fifth resistor, a gate of the sixth NMOS transistor is connected to the drain of the third NMOS transistor through the sixth resistor, and a source of the fifth NMOS transistor and a source of the sixth NMOS transistor are grounded.

In an embodiment of the present disclosure, the frequency compensation unit includes a seventh resistor and a first capacitor, a first end of the seventh resistor is connected to the output of the operational amplification unit, and a second end of the seventh resistor is grounded through the first capacitor.

In an embodiment of the present disclosure, the seventh resistor is an adjustable resistor.

In an embodiment of the present disclosure, the frequency compensation unit further includes an eighth resistor, a second capacitor, and a third capacitor, a first end of the second capacitor is connected to the second end of the seventh resistor, a second end of the second capacitor is grounded through the eighth resistor, and the third capacitor and the eighth resistor are connected in parallel.

In an embodiment of the present disclosure, the first bias module includes a third current source and a first transistor stack, and the third current source and the first transistor stack are connected in series between a supply voltage and ground; the first transistor stack includes K stages of cascoded transistors including at least a first-stage transistor and a last-stage transistor, a gate of each of the cascoded transistors is connected to its drain, and the gate of each of the cascoded transistors other than the first-stage transistor outputs a bias voltage; the third current source is connected to a drain of the last-stage transistor in the first transistor stack; K is also the number of transistors cascoded on one side of the first differential amplification module; the type of transistors in the first transistor stack is the same as that of the first differential amplification module.

In an embodiment of the present disclosure, the second bias module includes a fourth current source, a second transistor stack, and a fourth capacitor; the fourth current source and the second transistor stack are connected in series between a supply voltage and ground; the second transistor stack includes K stages of cascoded transistors including at least a first-stage transistor and a last-stage transistor, a gate of each of the cascoded transistors is connected to its drain and outputs a bias voltage, and the fourth capacitor is connected between a gate and source of the first-stage transistor in the second transistor stack; the fourth current source is connected to a drain of the last-stage transistor in the second transistor stack; K is also the number of transistors cascoded on one side of the second differential amplification module; the type of transistors in the second transistor stack is the same as that of the second differential amplification module.

In an embodiment of the present disclosure, each of the plurality of bias voltages is connected to a gate of a corresponding transistor in the amplification circuit through a corresponding resistor.

In an embodiment of the present disclosure, k is a natural number greater than or equal to 2.

The present disclosure also provides a power amplifier, the power amplifier includes: an amplification circuit and a bias circuit as described above; the bias circuit provides a plurality of bias voltages for the amplification circuit and controls an output common mode voltage output from the amplification circuit; the amplification circuit amplifies input signals based on output signals of the bias circuit, the amplification circuit includes a first differential amplification module and a second differential amplification module, the first differential amplification module and the second differential amplification module are complementarily stacked, each of the first differential amplification module and the second differential amplification module includes two cascode structures, and each cascode structure includes K transistors stacked together.

In an embodiment of the present disclosure, in the amplification circuit, a gate of each transistor other than main amplification transistors is connected to a gate capacitor, each gate capacitor has a first end and a second end, the second end of each gate capacitor whose first end is connected to a PMOS transistor is connected to a supply voltage, the second end of each gate capacitor whose first end is connected to an NMOS transistor is grounded.

In an embodiment of the present disclosure, a gate of each main amplification transistor in the amplification circuit is further connected to a corresponding input of the amplification circuit through an input capacitor.

As described above, the bias circuit and the power amplifier have the following beneficial effects:
 1. The bias circuit and the power amplifier of the present disclosure adopt direct sampling and direct feedback of the output common mode voltage of the amplification circuit, realizing precise control of the output common mode voltage, while the accuracy of the output common mode voltage is particularly important in an RF power amplifier with complementarily stacked NMOS transistors and PMOS transistors.
 2. The bias circuit and the power amplifier of the present disclosure adopt a novel resistor-capacitor hybrid circuit to achieve frequency compensation of a direct feedback loop that outputs the output common mode voltage, so as to maximize the available bandwidth of the feedback loop.

3. In the bias circuit and the power amplifier of the present disclosure, a DC bias is directly applied to gate voltages of MOS transistors through coscaded current mirrors, which not only reduces the number of feedback loops, but also increases the bandwidth and bias accuracy of the bias circuit.

REFERENCE NUMERALS

Figure 1:
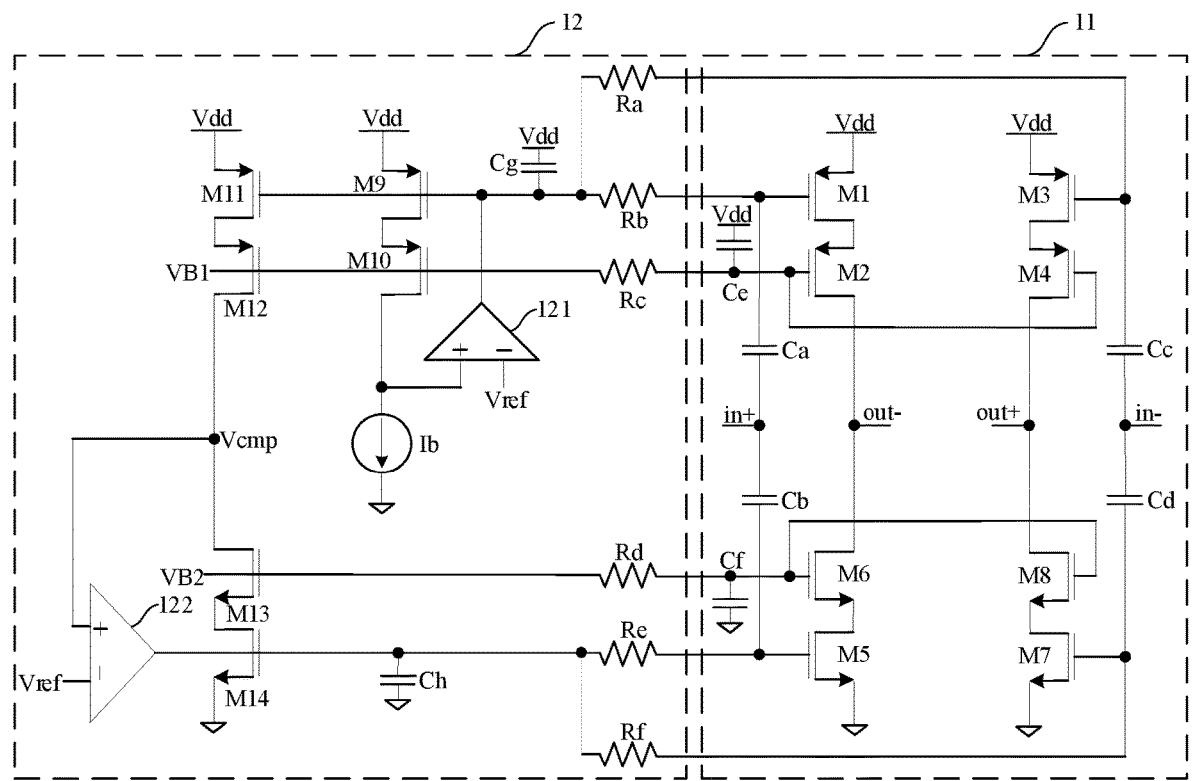
FIG. 1 is a common schematic structural diagram of a gate bias circuit and an amplifier with two stages of cascoded transistors in the prior art.

11 Amplifier including two stages of cascoded transistors
12 Gate bias circuit
121, 122 Operational amplifier
2 Bias circuit
21 Feedback module
211 Operational amplifier
211a Operational amplification unit
211b Frequency compensation unit
22a, 22b First bias module
221a, 221b First transistor stack
23a, 23b Second bias module
231a, 231b Second transistor stack
3 Amplification circuit
31a, 31b First differential amplification module
32a, 32b Second differential amplification module

DETAILED DESCRIPTION

The embodiments of the present disclosure will be described below through specific examples. One skilled in the art can easily understand other advantages and effects of the present disclosure according to contents disclosed in the description. The present disclosure may also be implemented or applied through other different embodiments, and various modifications or changes may be made to all details in the description based on different points of view and applications without departing from the spirit of the present disclosure.

Referring to FIGS. 1-6. It should be noted that the drawings provided herein only exemplify the basic idea of the present disclosure. Only components closely related to the present disclosure are shown in the drawings, and they are not necessarily drawn according to the quantities, shapes, and sizes of the components during actual implementation. During actual implementation, the patterns, quantities, and proportions of the components may be changed as needed, and the layout of the components may also be more complicated.

Gate bias of stacked MOS transistors is realized by a DC current mirror circuit, which includes an amplifier 11 including two stages of cascoded transistors, and a gate bias circuit 12 with a current mirroring function, as shown in FIG. 1. The amplifier 11 in FIG. 1 includes PMOS transistors M1, M2, M3, and M4, NMOS transistors M5, M6, M7, and M8, input capacitors Ca, Cb, Cc, and Cd, and gate capacitors Ce and Cf; the gate bias circuit 12 includes PMOS transistors M9, M10, M11, and M12, NMOS transistors M13 and M14, a current source Ib, operational amplifiers 121 and 122, capacitors Cg and Ch, and resistors Ra, Rb, Rc, Rd, Re, and Rf. The operational amplifier 121 and PMOS transistors M9 and M10 form an input of a first current mirror. Since the accuracy of a current mirror including nanoscale transistors substantially depends on gate-source voltages of their nanoscale transistors, the operational amplifier 121 is adopted to render the voltage at the input of the first current mirror consistent with a voltage at an output of the first current mirror, i.e., a drain voltage at a drain of the PMOS transistor M10 is controlled to approximate a reference voltage Vref to increase the accuracy of the first current mirror. The operational amplifier 122 and the NMOS transistors M13 and M14 form an input of a second current mirror, and the function of the operational amplifier 122 is similar to that of the operational amplifier 121, which increases the accuracy of the second current mirror. A current flowing through the PMOS transistors M9 and M10 (i.e., a current flowing through the current source Ib) is used to set bias voltages and bias currents of the PMOS transistors M1, M2, M3, and M4 in the amplifier 11, and the PMOS transistors M11 and M12 copy the current flowing through the current source Ib to a drain of the NMOS transistor M13 (i.e., the current flowing through the current source Ib also flows through the NMOS transistor M13), and the current flowing through NMOS transistors M13 and M14 is used to set bias voltages and bias currents of the NMOS transistors M5, M6, M7, and M8 in the amplifier 11. If the PMOS transistors M11 and M12 are well matched with the PMOS transistors M1, M2, M3, and M4, and the NMOS transistors M13 and M14 are well matched with the NMOS transistors M5, M6, M7, and M8, then a drain voltage (Vcmp=Vref) at the drain of the NMOS transistor M13 can be copied to an output of the amplifier 11.

It can be seen that a DC voltage at the output of the amplifier 11 in FIG. 1 is determined by a mirrored voltage and substantially depends on the degree of matching between the transistors. Due to a limited accuracy of the above-mentioned current mirrors, there is a large deviation between the DC voltage at the output of the amplifier 11 and the reference voltage Vref. Therefore, it cannot be guaranteed that the DC voltage at the output of the amplifier 11 can perfectly track the reference voltage Vref, and it also cannot be guaranteed that the DC voltage at the output of the amplifier 11 is of a preferred fixed value. In addition, the gate bias circuit 12 of FIG. 1 includes two feedback loops (i.e., the operational amplifier 121, the PMOS transistors M9 and M10, and the current source Ib form a first feedback loop, and the operational amplifier 122, and the NMOS transistors M13 and M14 form a second feedback loop), and using multiple feedback loops can easily reduce the effective bandwidth of the bias circuit. In order to solve the above problems, the present disclosure provides a bias circuit and a power amplifier, which will be described in detail below.

Embodiment 1

Figure 2:
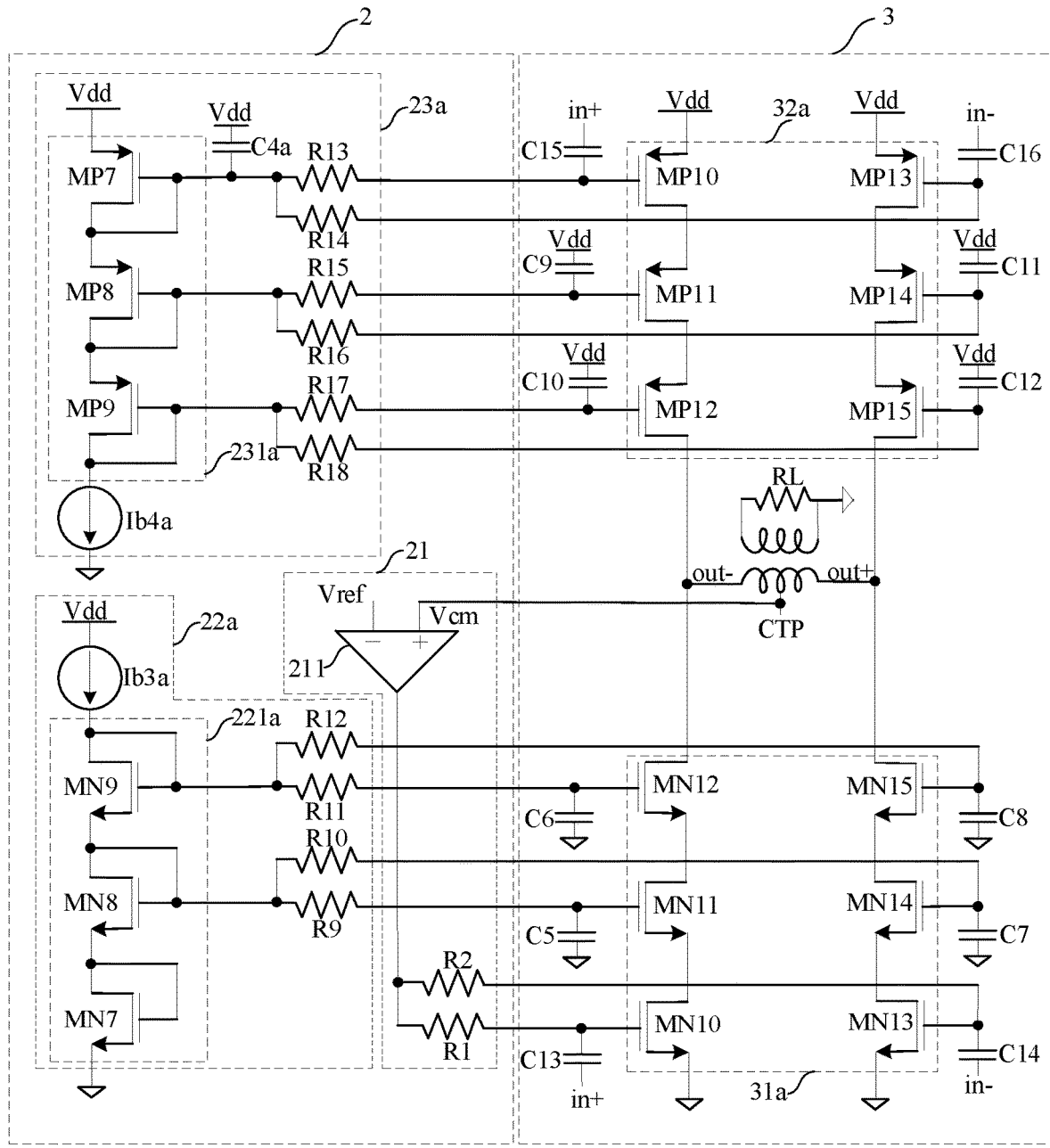
FIG. 2 is a schematic structural diagram of a bias circuit and an amplification circuit according to an embodiment of the present disclosure.

As shown in FIG. 2, Embodiment 1 provides a bias circuit 2. The bias circuit 2 provides a plurality of bias voltages for an amplification circuit 3. The amplification circuit 3 includes a first differential amplification module 31a and a second differential amplification module 32a, and the first differential amplification module 31a and the second differential amplification module 32a are complementarily stacked. "Complementarily stacked" means the type of transistors in the first differential amplification module 31a is different from that of transistors in the second differential amplification module 32a, for example, each transistor in the first differential amplification module 31a is an N-type metal-oxide-semiconductor (NMOS) transistor, and each transistor in the second differential amplification module 32a is a P− type metal-oxide-semiconductor (PMOS) transistor.

The bias circuit 2 includes a feedback module 21, a first bias module 22a including a plurality of transistors, and a second bias module 23a including a plurality of transistors.

As shown in FIG. 2, a first input of the feedback module 21 is connected to outputs of the amplification circuit 3 to receive an output common mode voltage Vcm (in one embodiment, the output common mode voltage Vcm is obtained from a center tap CTP of a primary coil of an output inductor of the amplification circuit 3; in actual implementation, specific connections regarding the first input of the feedback module 21 are determined according to the actual circuit structure), a second input of the feedback module 21 is connected to a reference voltage Vref, and outputs of the feedback module 21 are connected to gates of main amplification transistors (e.g., including a tenth NMOS transistor MN10 and a thirteenth NMOS transistor MN13 shown in FIG. 2) in the first differential amplification module 31a. Based on a difference between the output common mode voltage and the reference voltage Vref, the feedback module 21 adjusts gate voltages at the gates of the main amplification transistors (e.g., including the tenth NMOS transistor MN10 and the thirteenth NMOS transistor MN13 shown in FIG. 2) in the first differential amplification module 31a until the output common mode voltage Vcm is equal to the reference voltage Vref.

Figure 3:
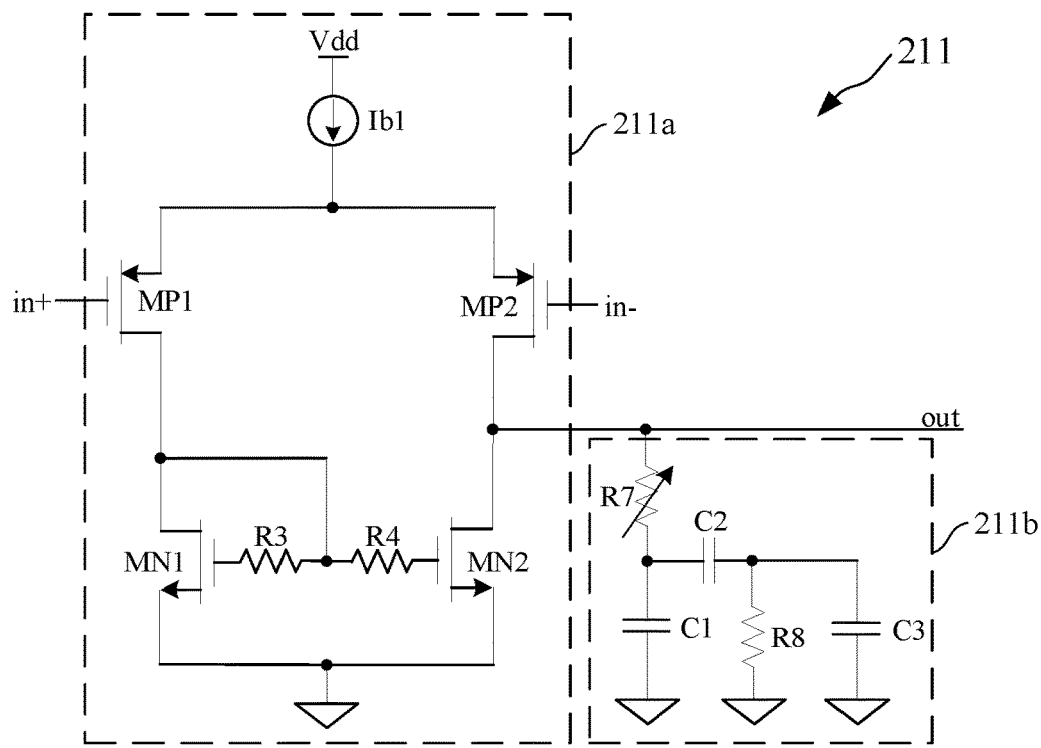
FIG. 3 is a schematic structural diagram of an operational amplifier according to an embodiment of the present disclosure.

In one embodiment, the feedback module 21 further includes an operational amplifier 211, a first resistor R1, and a second resistor R2. A non-inverting input of the operational amplifier 211 is connected to the output of the amplification circuit 3 to receive the output common mode voltage Vcm, an inverting input of the operational amplifier 211 is connected to the reference voltage Vref, an output of the operational amplifier 211 is connected to a gate of a first main amplification transistor (e.g., the tenth NMOS transistor MN10 shown in FIG. 2) in the first differential amplification module 31a through the first resistor R1, and the output of the operational amplifier 211 is connected to a gate of a second main amplification transistor (e.g., the thirteenth NMOS transistor MN13 shown in FIG. 2) in the first differential amplification module 31a through the second resistor R2. Referring to FIG. 3, the operational amplifier 211 includes an operational amplification unit 211a and a frequency compensation unit 211b. The operational amplification unit 211a amplifies the difference between the output common mode voltage Vcm and the reference voltage Vref. The frequency compensation unit 211b is connected to an output of the operational amplification unit 211a and realizes frequency compensation to make sure the operational amplifier feedback loop stable.

Figure 4:
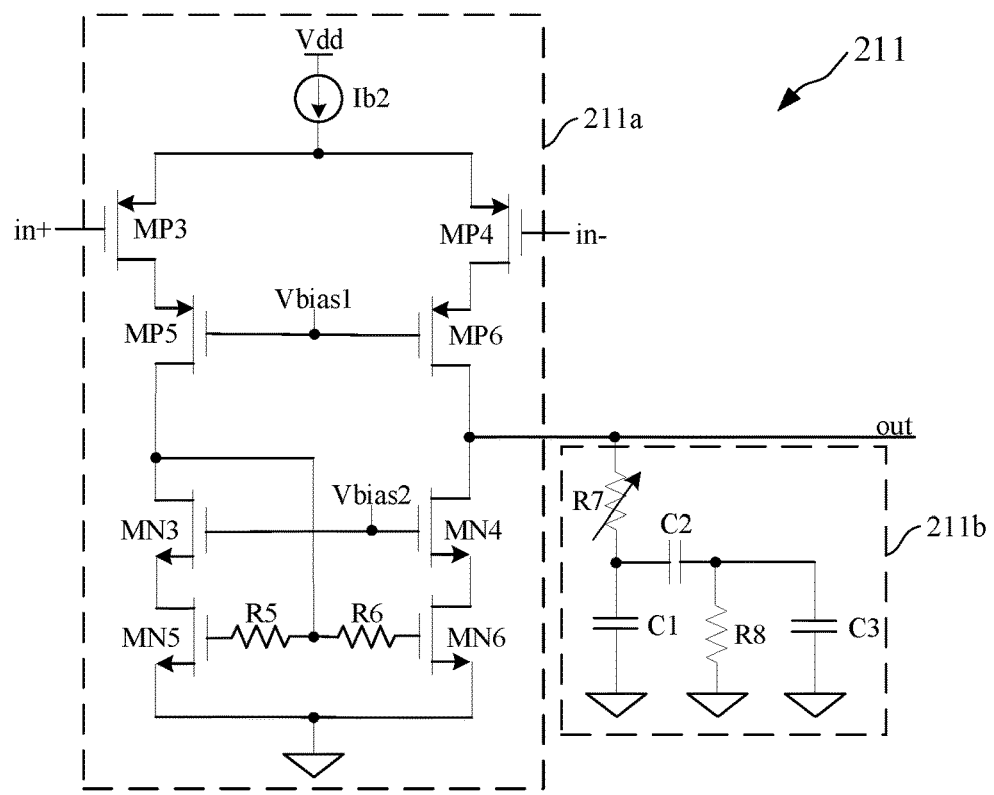
FIG. 4 is a schematic structural diagram of another operational amplifier according to an embodiment of the present disclosure.

In an embodiment, as shown in FIG. 3, the operational amplification unit 211a includes a first current source Ib1, a first PMOS transistor MP1, a second PMOS transistor MP2, a first NMOS transistor MN1, a second NMOS transistor MN2, a third resistor R3, and a fourth resistor R4. The first PMOS transistor MP1 and the second PMOS transistor MP2 form a pair of differential-input transistors, sources of the first PMOS transistor MP1 and the second PMOS transistor MP2 are connected to the first current source Ib1, a gate of the first PMOS transistor MP1 is connected to a non-inverting input in+ of the operational amplification unit 211a, and a gate of the second PMOS transistor MP2 is connected to an inverting input in− of the operational amplification unit 211a; a drain of the first NMOS transistor MN1 is connected to a drain of the first PMOS transistor MP1, a gate of the first NMOS transistor MN1 is connected to the drain of the first NMOS transistor MN1 through the third resistor R3, and a source of the first NMOS transistor MN1 is grounded; a drain of the second NMOS transistor MN2 is connected to the drain of the second PMOS transistor MP2 and the output of the operational amplification unit 211a, a gate of the second NMOS transistor MN2 is connected to the drain of the first NMOS transistor MN1 through the fourth resistor R4, and a source of the second NMOS transistor MN2 is grounded. The first PMOS transistor MP1, the second PMOS transistor MP2, the first NMOS transistor MN1, and the second NMOS transistor MN2 form an operational amplification structure, and the third resistor R3 and the fourth resistor R4 are used to expand the current mirror formed by the first NMOS transistor MN1 and the second NMOS transistor MN2. In another embodiment, as shown in FIG. 4, the operational amplification unit 211a includes a second current source Ib2, a third PMOS transistor MP3, a fourth PMOS transistor MP4, a fifth PMOS transistor MP5, a sixth PMOS transistor MP6, a third NMOS transistor MN3, a fourth NMOS transistor MN4, a fifth NMOS transistor MN5, a sixth NMOS transistor MN6, a fifth resistor R5, and a sixth resistor R6. The third PMOS transistor MP3 and the fourth PMOS transistor MP4 form a pair of differential-input transistors, sources of the third PMOS transistor MP3 and the fourth PMOS transistor MP4 are connected to the second current source Ib2, a gate of the third PMOS transistor MP3 is connected to the non-inverting input in+ of the operational amplification unit 211a, and a gate of the fourth PMOS transistor MP4 is connected to the inverting input in− of the operational amplification unit 211a; a source of the fifth PMOS transistor MP5 is connected to a drain of the third PMOS transistor MP3, and a drain of the fifth PMOS transistor MP5 is connected to a drain of the third NMOS transistor MN3; a source of the sixth PMOS transistor MP6 is connected to a drain of the fourth PMOS transistor MP4, a drain of the sixth PMOS transistor MP6 is connected to a drain of the fourth NMOS transistor MN4 and the output of the operational amplification unit 211a, and a gate of the fifth PMOS transistor MP5 and a gate of the sixth PMOS transistor MP6 are connected to a first bias voltage Vbias1; a source of the third NMOS transistor MN3 is connected to a drain of the fifth NMOS transistor MN5, a source of the fourth NMOS transistor MN4 is connected to a drain of the sixth NMOS transistor MN6, and a gate of the third NMOS transistor MN3 and a gate of the fourth NMOS transistor MN4 are connected to a second bias voltage Vbias2; a gate of the fifth NMOS transistor MN5 is connected to the drain of the third NMOS transistor MN3 through the fifth resistor R5, a gate of the sixth NMOS transistor MN6 is connected to the drain of the third NMOS transistor MN3 through the sixth resistor R6, and a source of the fifth NMOS transistor MN5 and a source of the sixth NMOS transistor MN6 are grounded.

It should be noted that, in actual implementation, any structure of an operational amplifier is applicable to the operational amplification unit 211a of the present disclosure. In the embodiment shown in FIG. 4, the operational amplification unit 211a adopts a cascoded structure including two stages of cascoded MOS transistors to increase a loop gain.

In an embodiment, as shown in FIG. 3 and FIG. 4, the frequency compensation unit 211b further includes a seventh resistor R7 and a first capacitor C1. A first end of the seventh resistor R7 is connected to the output of the operational amplification unit 211a, and a second end of the seventh resistor R7 is grounded through the first capacitor C1. In this embodiment, the seventh resistor R7 is an adjustable resistor. The seventh resistor R7 and the first capacitor C1 form a main compensation circuit, which is for tracking and offsetting pole-zero doublets formed by resistors and capacitors at nodes in a gain loop.

In another embodiment, the frequency compensation unit 211b further includes an eighth resistor R8, a second capacitor C2, and a third capacitor C3. A first end of the second capacitor C2 is connected to a second end of the seventh resistor R7, and a second end of the second capacitor C2 is grounded through the eighth resistor R8, and the third capacitor C3 and the eighth resistor R8 are connected in parallel. Different from a conventional dominant-pole compensation, the frequency compensation unit 211b of the present disclosure allows for the existence of multiple zero poles within an effective bandwidth, and the eighth resistor R8, the second capacitor C2, and the third capacitor C3 are used to adjust positions of multiple zero poles around 0 dB bandwidth and achieve the retracement of a phase response around the 0 dB bandwidth, thereby increasing a phase margin of a feedback loop and further increasing the effective bandwidth.

Figure 5:
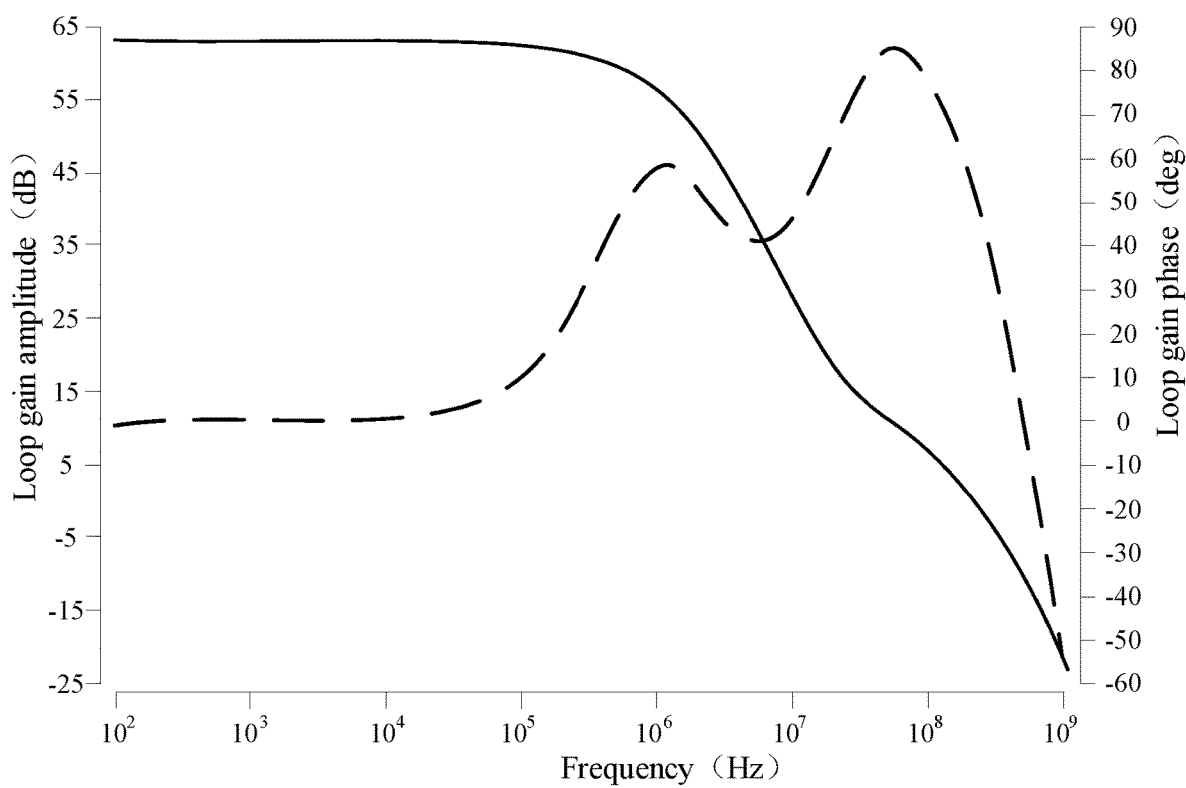
FIG. 5 is a schematic diagram of a frequency response curve of a bias circuit according to an embodiment of the present disclosure.

A frequency response curve of the bias circuit 2 of the present disclosure is shown in FIG. 5, and parameters of the frequency compensation unit 211b including resistors and capacitors are as follows: R7=1.25K ohm, C1=1 pF, R8=10K ohm, C2=1 pF, and C3=3.5 pF. The solid line represents a loop gain amplitude and the dashed line represents a loop gain phase. It can be seen from FIG. 5, there are still multiple zero poles within 0 dB (i.e., the frequency is about 222 MHz), there is a large peak retracement of the phase frequency before reaching 0 dB gain from lower frequency, and this peak retracement ensures that the loop has a sufficient phase margin. Compared to the frequency compensation of the present disclosure, the maximum 0 dB bandwidth this feedback loop can reach is only about 20 MHz if the conventional dominant-pole compensation technique is adopted.

It should be noted that the feedback module 21, the first differential amplification module 31a, and the output of the amplification circuit 3 form a negative feedback loop. In actual implementation, any circuit structure that can form a negative feedback loop along with the first differential amplification module 31a and the output of the amplification circuit 3 and control the output common mode voltage Vcm is applicable to the feedback module 21 of the present disclosure.

As shown in FIG. 2, the first bias module 22a provides a corresponding bias voltage for each transistor in the first differential amplification module 31a other than the main amplification transistors.

In an embodiment, the first bias module 22a includes a third current source Ib3a and a first transistor stack 221a, and the third current source Ib3a and a first transistor stack 221a are connected in series between a supply voltage Vdd and ground; the first transistor stack 221a includes K stages of cascoded transistors including at least a first-stage transistor (e.g., the seventh NMOS transistor MN7 shown in FIG. 2) and a last-stage transistor (e.g., the ninth NMOS transistor MN9 in FIG. 2), a gate of each of the cascoded transistors is connected to its drain, and the gate of each of the cascoded transistors other than the first-stage transistor outputs a bias voltage; the third current source Ib3a is connected to a drain of the last-stage transistor in the first transistor stack 221a; K is also the number of transistors cascoded on one side of the first differential amplification module 31a, with the first differential amplification modules including two sides, each side including K transistors; the type of transistors in the first transistor stack 221a is the same as that of the first differential amplification module 31a. In one embodiment, the first transistor stack 221a includes three NMOS transistors, for example, the seventh NMOS transistor MN7, an eighth NMOS transistor MN8, and the ninth NMOS transistor MN9. A source of the seventh NMOS transistor MN7 is grounded, and a gate and drain of the seventh NMOS transistor MN7 are connected to a source of the eighth NMOS transistor MN8, a gate and drain of the eighth NMOS transistor MN8 are connected to a source of the ninth NMOS transistor MN9, a gate and drain of the ninth NMOS transistor MN9 are connected to the third current source Ib3a. Each of the eighth NMOS transistor MN8 and the ninth NMOS transistor MN9 serves as a current mirror and generates a corresponding bias voltage. In another embodiment, the first bias module 22a further includes a ninth resistor R9, a tenth resistor R10, an eleventh resistor R11, and a twelfth resistor R12. The gate of the eighth NMOS transistor MN8 outputs third bias voltages through the ninth resistor R9 and the tenth resistor R10 respectively. The gate of the ninth NMOS transistor MN9 outputs fourth bias voltages through the eleventh resistor R11 and the twelfth resistor R12 respectively. Each resistor in the first bias module 22a is used to isolate the first bias module 22a from a signal path of the amplification circuit 3 to prevent the first bias module 22a from affecting the signal path of the amplification circuit 3.

As shown in FIG. 2, the second bias module 23a provides a corresponding bias voltage for each transistor in the second differential amplification module 32a.

Specifically, the second bias module 23a includes a fourth current source Ib4a, a second transistor stack 231a, and a fourth capacitor C4a. The fourth current source Ib4a and the second transistor stack 231a are connected in series between a supply voltage Vdd and ground; the second transistor stack includes K stages of cascoded transistors including at least a first-stage transistor (e.g., the seventh PMOS transistor MP7 shown in FIG. 2) and a last-stage transistor (e.g., the ninth PMOS transistor MP9 shown in FIG. 2), a gate of each of the cascoded transistors is connected to its drain and outputs a bias voltage, and the fourth capacitor C4a is connected between a gate and source of the first-stage transistor in the second transistor stack 231a; the fourth current source Ib4a is connected to a drain of the last-stage transistor in the second transistor stack 231a; K is also the number of transistors cascoded on one side of the second differential amplification module 32a, with the second differential amplification modules including two sides, each side including K transistors; the type of transistors in the second transistor stack 231a is the same as that of the second differential amplification module 32a. In one embodiment, the second transistor stack 231a includes three PMOS transistors, for example, the seventh PMOS transistor MP7, an eighth PMOS transistor MP8, and the ninth PMOS transistor MP9. A source of the seventh PMOS transistor MP7 is connected to the supply voltage Vdd, a gate and drain of the seventh PMOS transistor MP7 are connected to a source of the eighth PMOS transistor MP8, a gate and drain of the eighth PMOS transistor MP8 are connected to a source of the ninth PMOS transistor MP9, a gate and drain of the ninth PMOS transistor MP9 are connected to the fourth current source Ib4. Each of the seventh PMOS transistor MP7, the eighth PMOS transistor MP8, and the ninth PMOS transistor MP9 serves as a current mirror and generates a corresponding bias voltage. In another embodiment, the second bias module 23a further includes a thirteenth resistor R13, a fourteenth resistor R14, a fifteenth resistor R15, a sixteenth resistor R16, a seventeenth resistor R17, and an eighteenth resistor R18. The gate of the seventh PMOS transistor MP7 outputs fifth bias voltages through the thirteenth resistor R13 and the fourteenth resistor R14 respectively, the gate of the eighth PMOS transistor MP8 outputs sixth bias voltages through the fifteenth resistor R15 and the sixteenth resistor R16 respectively, and the gate of the ninth PMOS transistor MP9 outputs seventh bias voltages through the seventeenth resistor R17 and the eighteenth resistor R18 respectively. Each resistor in the second bias module 23a is used to isolate the second bias module 23a from the signal path of the amplification circuit 3 to prevent the second bias module 23a from affecting the signal path of the amplification circuit 3.

It should be noted that K is a natural number greater than or equal to 2, and the value of K can be adjusted as needed in actual implementation. Bias voltages generated by the first-stage transistor in the first transistor stack 221a need not to be output to the amplification circuit 3, and the other bias voltages generated by each transistor in the first transistor stack 221a other than the first-stage transistor are output to the gates of the corresponding transistors in the amplification circuit 3. In a bias circuit with a two-stage cascoded structure (i.e., K=2), the drain-source voltage difference of each transistor is not tracking well, and the accuracy of the current source is therefore limited, while in a bias circuit with a three-stage cascoded structure (i.e., K≥3), the matching of the drain-source voltage difference of each transistor is largely improved, thus increasing the accuracy of the current mirror of the bias circuit.

As shown in FIG. 2, the present disclosure also provides a power amplifier. The power amplifier includes the bias circuit 2 and the amplification circuit 3.

As shown in FIG. 2, the bias circuit 2 provides a plurality of bias voltages for the amplification circuit 3 and controls an output common mode voltage Vcm output from the amplification circuit 3.

The structure and principle of the bias circuit 2 are described above.

As shown in FIG. 2, the amplification circuit 3 amplifies input signals based on output signals of the bias circuit 2.

In an embodiment, the amplification circuit 3 includes the first differential amplification module 31a and the second differential amplification module 32a; the first differential amplification module 31a and the second differential amplification module 32a are complementarily stacked; each of the first differential amplification module 31a and the second differential amplification module 32a includes two cascode (i.e., common-source common-gate, CSCG) structures, and each cascode structure includes K transistors stacked together. In one embodiment, the first differential amplification module 31a includes three pairs of N-type differential transistors, which are stacked together, and the second differential amplification module 32a includes three pairs of P-type differential transistors, which are stacked together.

In an embodiment, the first differential amplification module 31a includes the tenth NMOS transistor MN10, an eleventh NMOS transistor MN11, a twelfth NMOS transistor MN12, the thirteenth NMOS transistor MN13, a fourteenth NMOS transistor MN14, and a fifteenth NMOS transistor MN15. A source of the tenth NMOS transistor MN10 is grounded, a gate of the tenth NMOS transistor MN10 is connected to a non-inverting input in+ of the amplification circuit 3, a drain of the tenth NMOS transistor MN10 is connected to a source of the eleventh NMOS transistor MN11, a drain of the eleventh NMOS transistor MN11 is connected to a source of the twelfth NMOS transistor MN12, a drain of the twelfth NMOS transistor MN12 is connected to an inverting input out− of the amplification circuit 3. The tenth NMOS transistor MN10, the eleventh NMOS transistor MN11, and the twelfth NMOS transistor MN12 form a cascode structure (i.e., a CSCG structure). A source of the thirteenth NMOS transistor MN13 is grounded, a gate of the thirteenth NMOS transistor MN13 is connected to an inverting input in− of the amplification circuit 3, a drain of the thirteenth NMOS transistor MN13 is connected to a source of the fourteenth NMOS transistor MN14, a drain of the fourteenth NMOS transistor MN14 is connected to a source of the fifteenth NMOS transistor MN15, a drain of the fifteenth NMOS transistor MN15 is connected to a non-inverting input out+ of the amplification circuit 3. The thirteenth NMOS transistor MN13, the fourteenth NMOS transistor MN14, and the fifteenth NMOS transistor MN15 form a cascode structure (i.e., a CSCG structure). The gate of the tenth NMOS transistor MN10 and the gate the thirteenth NMOS transistor MN13 are connected to the outputs of the feedback module 21 in the bias circuit 2. The gates of the eleventh NMOS transistor MN11 and the fourteenth NMOS transistor MN14 receive the third bias voltages generated by the eighth NMOS transistor MN8 in the bias circuit 2. The gates of the twelfth NMOS transistor MN12 and the fifteenth NMOS transistor MN15 receive the fourth bias voltages generated by the ninth NMOS transistor MN9 in the bias circuit 2.

In an embodiment, the second differential amplification module 32a includes the tenth PMOS transistor MP10, an eleventh PMOS transistor MP11, a twelfth PMOS transistor MP12, the thirteenth PMOS transistor MP13, a fourteenth PMOS transistor MP14, and a fifteenth PMOS transistor MP15. A source of the tenth PMOS transistor MP10 is connected to a supply voltage Vdd of the second differential amplification module 32a, a gate of the tenth PMOS transistor MP10 is connected to the non-inverting input in+ of the amplification circuit 3, a drain of the tenth PMOS transistor MP10 is connected to a source of the eleventh PMOS transistor MP11, a drain of the eleventh PMOS transistor MP11 is connected to a source of the twelfth PMOS transistor MP12, and a drain of the twelfth PMOS transistor MP12 is connected to the inverting input out− of the amplification circuit 3. The tenth PMOS transistor MP10, the eleventh PMOS transistor MP11, and the twelfth PMOS transistor MP12 form a cascode structure (i.e., a CSCG structure). A source of the thirteenth PMOS transistor MP13 is connected to the supply voltage Vdd of the second differential amplification module 32a, a gate of the thirteenth PMOS transistor MP13 is connected to the non-inverting input in− of the amplification circuit 3, a drain of the thirteenth PMOS transistor MP13 is connected to a source of the fourteenth PMOS transistor MP14, a drain of the fourteenth PMOS transistor MP14 is connected to a source of the fifteenth PMOS transistor MP15, and a drain of the fifteenth PMOS transistor MP15 is connected to the non-inverting input out+ of the amplification circuit 3. The thirteenth PMOS transistor MP13, the fourteenth PMOS transistor MP14, and the fifteenth PMOS transistor MP15 form a cascode structure (i.e., a CSCG structure). The gates of the tenth PMOS transistor MP10 and the thirteenth PMOS transistor MP13 receive the fifth bias voltages generated by the seventh PMOS transistor MP7 in the bias circuit 2. The gates of the eleventh PMOS transistor MP11 and the fourteenth PMOS transistor MP14 receive the sixth bias voltages generated by the eighth PMOS transistor MP8 in the bias circuit 2. The gates of the twelfth PMOS transistor MP12 and the fifteenth PMOS transistor MP15 receive the seventh bias voltages generated by the ninth PMOS transistor MP9 in the bias circuit 2.

In an embodiment, in the amplification circuit 3, a gate of each transistor other than main amplification transistors is connected to a gate capacitor, each gate capacitor has a first end and a second end, the second end of each gate capacitor whose first end is connected to a PMOS transistor is connected to the supply voltage Vdd, the second end of each gate capacitor whose first end is connected to an NMOS transistor is grounded. As shown in FIG. 2, gate capacitors in the amplification circuit 3 include a first-type gate capacitor connected to NMOS transistors and a second-type gate capacitor connected to PMOS transistors, the first-type gate capacitor includes a first gate capacitor C5, a second gate capacitor C6, a third gate capacitor C7, and a fourth gate capacitor C8, and the second-type gate capacitor includes a fifth gate capacitor C9, a sixth gate capacitor C10, a seventh gate capacitor C11, and an eighth gate capacitor C12. A first end of the first gate capacitor C5 is connected to the gate of the eleventh NMOS transistor MN11, and a second end of the first gate capacitor C5 is grounded; a first end of the second gate capacitor C6 is connected to the gate of the twelfth NMOS transistor MN12, and a second end of the second gate capacitor C6 is grounded; a first end of the third gate capacitor C7 is connected to the gate of the fourteenth NMOS transistor MN14, and a second end of the third gate capacitor C7 is grounded; a first end of the fourth gate capacitor C8 is connected to the gate of the fifteenth NMOS transistor MN15, and a second end of the fourth gate capacitor C8 is grounded; the drain-source voltage differences of the tenth NMOS transistor MN10, the eleventh NMOS transistor MN11, and the twelfth NMOS transistor MN12 are determined by capacitances of the first gate capacitor C5 and the second gate capacitor C6, and a ratio of the capacitance of the first gate capacitor C5 to the capacitance of the second gate capacitor C6. The drain-source voltage differences of the thirteenth NMOS transistor MN13, the fourteenth NMOS transistor MN14, and the fifteenth NMOS transistor MN15 are determined by capacitances of the third gate capacitor C7 and the fourth gate capacitor C8, and a ratio of the capacitance of the third gate capacitor C7 to the capacitance of the fourth gate capacitor C8. A first end of the fifth gate capacitor C9 is connected to the gate of the eleventh PMOS transistor MP11, and a second end of the fifth gate capacitor C9 is connected to the supply voltage Vdd; a first end of the sixth gate capacitor C10 is connected to the gate of the twelfth PMOS transistor MP12, and a second end of the sixth gate capacitor C10 is connected to the supply voltage Vdd; a first end of the seventh gate capacitor C11 is connected to the gate of the fourteenth PMOS transistor MP14, and a second end of the seventh gate capacitor C11 is connected to the supply voltage Vdd; a first end of the eighth gate capacitor C12 is connected to the gate of the fifteenth PMOS transistor MP15, and a second end of the eighth gate capacitor C12 is connected to the supply voltage Vdd; the drain-source voltage differences of the tenth PMOS transistor MP10, the eleventh PMOS transistor MP11, and the twelfth PMOS transistor MP12 are determined by capacitances of the fifth gate capacitor C9 and the sixth gate capacitor C10, and a ratio of the capacitance of the fifth gate capacitor C9 to the capacitance of the sixth gate capacitor C10. The drain-source voltage differences of the thirteenth PMOS transistor MP13, the fourteenth PMOS transistor MP14 and the fifteenth PMOS transistor MP15 are determined by the capacitances the seventh gate capacitor C11 and the eighth gate capacitor C12, and a ratio of the capacitance of the seventh gate capacitor C11 to the capacitance of the eighth gate capacitor C12.

In an embodiment, a gate of each main amplification transistor in the amplification circuit 3 is further connected to a corresponding input of the amplification circuit 3 through an input capacitor. As shown in FIG. 2, input capacitors includes a first input capacitor C13, a second input capacitor C15, a third input capacitor C14, and a fourth input capacitor C16; the gate of the tenth NMOS transistor MN10 is connected to the non-inverting input in+ of the amplification circuit 3 through the first input capacitor C13, the gate of the tenth PMOS transistor MP10 is connected to the non-inverting input in+ of the amplification circuit 3 through the second input capacitor C15, the gate of the thirteenth NMOS transistor MN13 is connected to the inverting input in− of the amplification circuit 3 through a third input capacitor C14, and the gate of the thirteenth PMOS transistor MP13 is connected to the inverting input in− of the amplification circuit 3 through the fourth input capacitor C16.

In one embodiment, the outputs of the amplification circuit 3 are connected to a load RL through an output inductor, and the output common mode voltage Vcm is obtained from the center tap CTP of the primary coil of the output inductor. In actual implementation, the outputs of the amplification circuit 3 can be connected to corresponding devices as needed and the output common mode voltage Vcm is obtained from a corresponding node.

By adopting direct sampling and direct feedback, the present disclosure achieves functional separation of the bias circuit and the signal path, and solves problems regarding bias accuracy, bias tracking, and limited bias bandwidth. Moreover, the present disclosure adopts a gate bias structure with a multi-stage cascoded mirror currents applied in a CMOS process at the nanometer level, which not only effectively overcomes the problem of insufficient accuracy in existing gate bias structures, but also discards commonly used multiple feedback loops, thus effectively expanding the bandwidth of the bias circuit.

Embodiment 2

Figure 6:
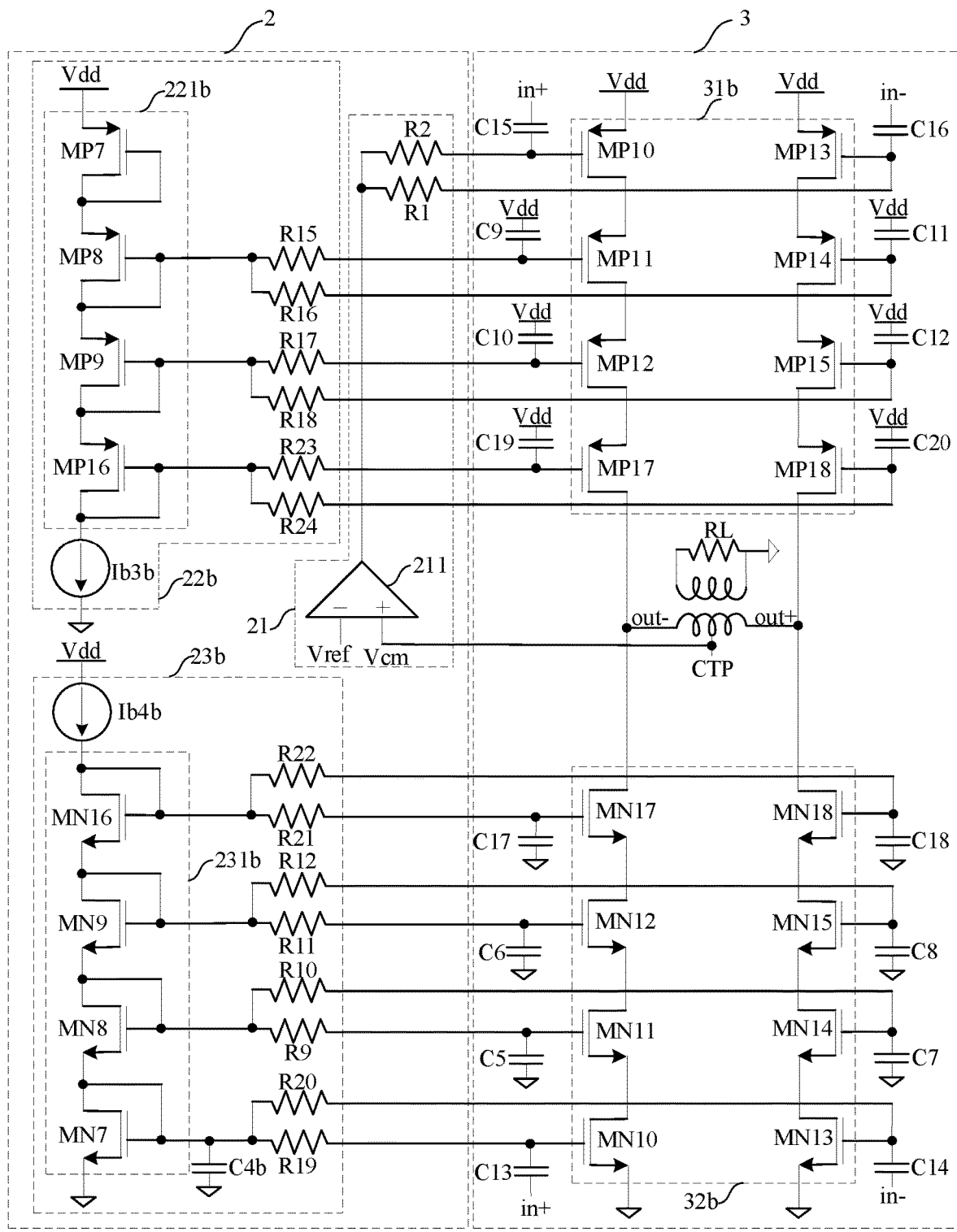
FIG. 6 is another schematic structural diagram of a bias circuit and an amplification circuit according to an embodiment of the present disclosure.

As shown in FIG. 6, Embodiment 2 provides a bias circuit 2 and a corresponding power amplifier, which differs from Embodiment 1 is that the bias circuit 2 and the amplification circuit 3 in the power amplifier of Embodiment 2 are both four-stage cascoded transistors, and each transistor in the first differential amplification module 31b is a PMOS transistor, and each transistor in the second differential amplification module 32b is an NMOS transistor.

As shown in FIG. 6, the bias circuit 2 includes a feedback module 21, a first bias module 22b including a plurality of transistors, and a second bias module 23b including a plurality of transistors.

In an embodiment, outputs of the feedback module 21 are connected to gates of main amplification transistors (e.g., including a tenth PMOS transistor MP10 and a thirteenth PMOS transistor MP13 shown in FIG. 6) of the first differential amplification module 31b.

In an embodiment, the first bias module 22b includes a third current source Ib3b and a first transistor stack 221b, and the third current source Ib3b and the first transistor stack 221b are connected in series between the supply voltage Vdd and ground. The first transistor stack 221b includes four PMOS transistors, for example, a seventh PMOS transistor MP7, an eighth PMOS transistor MP8, a ninth PMOS transistor MP9, and a sixteenth PMOS transistor MP16; in other words, the first transistor stack 221b can be obtained by adding a current mirror (e.g., the sixteenth PMOS transistor MP16) to the second transistor stack 231a of Embodiment 1; a source of the sixteenth PMOS transistor MP16 is connected to a drain of the ninth PMOS transistor MP9, and a gate and a drain of the sixteenth PMOS transistor MP16 are connected to the third current source Ib3b. The gate of the sixteenth PMOS transistor MP16 outputs bias voltages through a twenty-third resistor R23 and a twenty-fourth resistor R24 respectively. The seventh PMOS transistor MP7 does not output a bias voltage.

In an embodiment, the second bias module 23b includes a fourth current source Ib4b and a second transistor stack 231b, and the fourth current source Ib4b and the second transistor stack 231b are connected in series between the supply voltage Vdd and ground. The second transistor stack 231b includes four NMOS transistors, for example, a seventh NMOS transistor MN7, an eighth NMOS transistor MN8, a ninth NMOS transistor MN9, and a sixteenth NMOS transistor MN16; in other words, the second transistor stack 231b can be obtained by adding a current mirror (e.g., the sixteenth NMOS transistor MN16) to the first transistor stack 221a of Embodiment 1; a source of the sixteenth NMOS transistor MN16 is connected to a drain of the ninth NMOS transistor MN9, and a gate and drain of the sixteenth NMOS transistor MN16 are connected to the fourth current source Ib4b. The gate of the sixteenth NMOS transistor MN16 outputs eighth bias voltages through a twenty-first resistor R21 and a twenty-second resistor R22 respectively. A gate of the seventh NMOS transistor MN7 outputs ninth bias voltages through a nineteenth resistor R19 and a twentieth resistor R20 respectively, and provides these bias voltages to the gates of main amplification transistors (e.g., including a tenth NMOS transistor MN10 and a thirteenth NMOS transistor MN13 in FIG. 6) of a second differential amplification module 32b. A first end of a fourth capacitor C4b is connected to a gate of a seventh NMOS transistor MN7, and a second end of the fourth capacitor C4b is grounded.

In one embodiment, the first differential amplification module 31b includes four pairs of P-type differential transistors, which are stacked together; in other words, the first differential amplification module 31b in this embodiment can be obtained by adding one stage of transistors (e.g., including a seventeenth PMOS transistor MP17 and an eighteenth PMOS transistor MP18) to the second differential amplification module 32a of Embodiment 1. A source of a seventeenth PMOS transistor MP17 is connected to a drain of a twelfth PMOS transistor MP12, a drain of the seventeenth PMOS transistor MP17 is connected to an inverting output out− of the amplification circuit 3, a source of an eighteenth PMOS transistor MP18 is connected to a drain of a fifteenth PMOS transistor MP15, and a drain of the eighteenth PMOS transistor MP18 is connected to a non-inverting output out+ of the amplification circuit 3. Both a gate of the seventeenth PMOS transistor MP17 and a gate of the eighteenth PMOS transistor MP18 receive a bias voltage generated by the sixteenth PMOS transistor MP16 in the bias circuit 2, the gate of the seventeenth PMOS transistor MP17 is connected to a first end of a ninth gate capacitor C19, the gate of the eighteenth PMOS transistor MP18 is connected to a first end of the tenth gate capacitor C20, and a second end of the ninth gate capacitor C19 and a second end of the tenth gate capacitor C20 are connected to the supply voltage Vdd of the amplification circuit 3.

In an embodiment, the second differential amplification module 32b includes four pairs of N-type differential transistors, which are stacked together; in other words, the second differential amplification module 32b in this embodiment can be obtained by adding one stage of transistors (e.g., including a seventeenth NMOS transistor MN17 and an eighteenth NMOS transistor MN18 shown in FIG. 6) to the second differential amplification module 32b of Embodiment 1. A source of the seventeenth NMOS transistor MN17 is connected to a drain of the twelfth NMOS transistor MN12, a drain of the seventeenth NMOS transistor MN17 is connected to the inverting output out− of the amplification circuit 3, a source of the eighteenth NMOS transistor MN18 is connected to a drain of a fifteenth NMOS transistor MN15, and a drain of the seventeenth NMOS transistor MN17 is connected to the non-inverting output out+ of the amplification circuit 3. Both a gate of the seventeenth NMOS transistor MN17 and a gate of the eighteenth NMOS transistor MN18 receive a bias voltage generated by a sixteenth NMOS transistor MN16 in the bias circuit 2, the gate of the seventeenth NMOS transistor MN17 is connected to a first end of an eleventh gate capacitor C17, the gate of the eighteenth NMOS transistor MN18 is connected to a first end of a twelfth gate capacitor C18, and a second end of the eleventh gate capacitor C17 and a second end of the twelfth gate capacitor C18 are grounded.

It should be noted that in Embodiment 2, the drain-source voltage differences of transistors cascoded on one side of each differential amplification module are determined by capacitances of three corresponding gate capacitors and ratios regarding the capacitances of the three gate capacitors, which are similar to Embodiment 1.

In summary, the present disclosure provides a bias circuit and a power amplifier. The bias circuit includes a feedback module, a first bias module including a plurality of transistors, and a second bias module including a plurality of transistors; a first input of the feedback module is connected to an output of the amplification circuit to receive an output common mode voltage, a second input of the feedback module is connected to a reference voltage, and outputs of the feedback module are connected to gates of main amplification transistors in the first differential amplification module; based on a difference between the output common mode voltage and the reference voltage, the feedback module adjusts gate voltages at the gates of the main amplification transistors in the first differential implication module until the output common mode voltage is equal to the reference voltage; the first bias module provides a corresponding bias voltage for each transistor in the first differential amplification module other than the main amplification transistors; the second bias module provides a corresponding bias voltage for each transistor in the second differential amplification module; each transistor in the first differential amplification module is an NMOS transistor, and each transistor in the second differential amplification module is a PMOS transistor; or each transistor in the first differential amplification module is a PMOS transistor, and each transistor in the second differential amplification module is an NMOS transistor. The bias circuit and the power amplifier of the present disclosure precisely control the output common mode voltage of the amplifier through direct sampling and direct feedback of the output common mode voltage of the main amplifier circuit. The stability of the direct feedback loop is ensured by a compensation circuit with a combination of resistors and capacitors, and the bandwidth of the direct feedback loop can be extended by a factor of 4 to 10; due to advantageous characteristics of multiple stacked transistors, a bias circuit with multiple stages of cascoded current mirrors is introduced, which not only gets rid of additional feedback loops, but also improves the effective bandwidth and effective bias accuracy of the bias circuit.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A bias circuit, for providing a plurality of bias voltages for an amplification circuit, wherein the amplification circuit comprises a first differential amplification module and a second differential amplification module, and the first differential amplification module and the second differential amplification module are complementarily stacked; wherein the bias circuit comprises:
   a feedback module, a first bias module comprising a plurality of transistors, and a second bias module comprising a plurality of transistors;
   wherein a first input of the feedback module is connected to an output of the amplification circuit to receive an output common mode voltage, a second input of the feedback module is connected to a reference voltage, and outputs of the feedback module are connected to gates of main amplification transistors in the first differential amplification module; wherein based on a difference between the output common mode voltage and the reference voltage, the feedback module adjusts gate voltages at the gates of the main amplification transistors in the first differential implication module until the output common mode voltage is equal to the reference voltage;
   wherein the first bias module provides a corresponding bias voltage for each transistor in the first differential amplification module other than the main amplification transistors;
   wherein the second bias module provides a corresponding bias voltage for each transistor in the second differential amplification module;
   wherein each transistor in the first differential amplification module is an N-metal-oxide-semiconductor (NMOS) transistor, and each transistor in the second differential amplification module is a P-metal-oxide-semiconductor (PMOS) transistor; or each transistor in the first differential amplification module is a PMOS transistor, and each transistor in the second differential amplification module is an NMOS transistor.

2. The bias circuit according to claim 1, wherein the feedback module comprises an operational amplifier, a first resistor, and a second resistor; wherein a non-inverting input of the operational amplifier is connected to the output of the amplification circuit to receive the output common mode voltage, an inverting input of the operational amplifier is connected to the reference voltage, an output of the operational amplifier is connected to a gate of a first main amplification transistor in the first differential amplification module through the first resistor, and the output of the operational amplifier is connected to a gate of a second main amplification transistor in the first differential amplification module through the second resistor.

3. The bias circuit according to claim 2, wherein the operational amplifier comprises an operational amplification unit and a frequency compensation unit;
   wherein the operational amplification unit amplifies the difference between the output common mode voltage and the reference voltage;
   wherein the frequency compensation unit is connected to an output of the operational amplification unit, and is for frequency compensation.

4. The bias circuit according to claim 3, wherein the operational amplification unit comprises a first current source, a first PMOS transistor, a second PMOS transistor, a first NMOS transistor, a second NMOS transistor, a third resistor, and a fourth resistor;
   wherein the first PMOS transistor and the second PMOS transistor form a pair of differential-input transistors, sources of the first PMOS transistor and the second PMOS transistor are connected to the first current source, a gate of the first PMOS transistor is connected to the non-inverting input of the operational amplification unit, and a gate of the second PMOS transistor is connected to the inverting input of the operational amplification unit;
   wherein a drain of the first NMOS transistor is connected to a drain of the first PMOS transistor, a gate of the first NMOS transistor is connected to the drain of the first NMOS transistor through the third resistor, and a source of the first NMOS transistor is grounded;
   wherein a drain of the second NMOS transistor is connected to a drain of the second PMOS transistor and the output of the operational amplification unit, a gate of the second NMOS transistor is connected to the drain of the first NMOS transistor through the fourth resistor, and a source of the second NMOS transistor is grounded.

5. The bias circuit according to claim 3, wherein the operational amplification unit comprises a second current source, a third PMOS transistor, a fourth PMOS transistor, a fifth PMOS transistor, a sixth PMOS transistor, a third NMOS transistor, a fourth NMOS transistor, a fifth NMOS transistor, a sixth NMOS transistor, a fifth resistor, and a sixth resistor;
   wherein the third PMOS transistor and the fourth PMOS transistor form a pair of differential-input transistors, sources of the third PMOS transistor and the fourth PMOS transistor are connected to the second current source, a gate of the third PMOS transistor is connected to the non-inverting input of the operational amplification unit, and a gate of the fourth PMOS transistor is connected to the inverting input of the operational amplification unit;

wherein a source of the fifth PMOS transistor is connected to a drain of the third PMOS transistor, a drain of the fifth PMOS transistor is connected to a drain of the third NMOS transistor, a source of the sixth PMOS transistor is connected to a drain of the fourth PMOS transistor, a drain of the sixth PMOS transistor is connected to a drain of the fourth NMOS transistor and the output of the operational amplification unit, and a gate of the fifth PMOS transistor and a gate of the sixth PMOS transistor are connected to a first bias voltage;

wherein a source of the third NMOS transistor is connected to a drain of the fifth NMOS transistor, a source of the fourth NMOS transistor is connected to a drain of the sixth NMOS transistor, and a gate of the third NMOS transistor and a gate of the fourth NMOS transistor are connected to a second bias voltage;

wherein a gate of the fifth NMOS transistor is connected to the drain of the third NMOS transistor through the fifth resistor, a gate of the sixth NMOS transistor is connected to the drain of the third NMOS transistor through the sixth resistor, and a source of the fifth NMOS transistor and a source of the sixth NMOS transistor are grounded.

6. The bias according to claim 3, wherein the frequency compensation unit comprises a seventh resistor and a first capacitor, wherein a first end of the seventh resistor is connected to the output of the operational amplification unit, and a second end of the seventh resistor is grounded through the first capacitor.

7. The bias circuit according to claim 6, wherein the seventh resistor is an adjustable resistor.

8. The bias circuit according to claim 6, wherein the frequency compensation unit further comprises an eighth resistor, a second capacitor, and a third capacitor, wherein a first end of the second capacitor is connected to the second end of the seventh resistor, a second end of the second capacitor is grounded through the eighth resistor, and the third capacitor and the eighth resistor are connected in parallel.

9. The bias circuit according to claim 1, wherein the first bias module comprises a third current source and a first transistor stack, and the third current source and the first transistor stack are connected in series between a supply voltage and ground; wherein the first transistor stack comprises K stages of cascoded transistors comprising at least a first-stage transistor and a last-stage transistor, a gate of each of the cascoded transistors is connected to its drain, and the gate of each of the cascoded transistors other than the first-stage transistor outputs a bias voltage; wherein the third current source is connected to a drain of the last-stage transistor in the first transistor stack; wherein K is also the number of transistors cascoded on one side of the first differential amplification module; wherein the type of transistors in the first transistor stack is the same as that of the first differential amplification module.

10. The bias circuit according to claim 1, wherein the second bias module comprises a fourth current source, a second transistor stack, and a fourth capacitor; wherein the fourth current source and the second transistor stack are connected in series between a supply voltage and ground; wherein the second transistor stack comprises K stages of cascoded transistors comprising at least a first-stage transistor and a last-stage transistor, a gate of each of the cascoded transistors is connected to its drain and outputs a bias voltage, and the fourth capacitor is connected between a gate and source of the first-stage transistor in the second transistor stack; wherein the fourth current source is connected to a drain of the last-stage transistor in the second transistor stack; wherein K is also the number of transistors cascoded on one side of the second differential amplification module; wherein K is a natural number greater than or equal to 2; wherein the type of transistors in the second transistor stack is the same as that of the second differential amplification module.

11. The bias circuit according to claim 9, wherein each of the plurality of bias voltages is connected to a gate of a corresponding transistor in the amplification circuit through a corresponding resistor.

12. The bias circuit according to claim 9, wherein K is a natural number greater than or equal to 2.

13. A power amplifier, wherein the power amplifier comprises:
    the amplification circuit, and the bias circuit as claimed in claim 1;
    wherein the bias circuit provides the plurality of bias voltages for the amplification circuit and controls the output common mode voltage from the amplification circuit;
    wherein the amplification circuit amplifies input signals based on output signals of the bias circuit, the amplification circuit comprises the first differential amplification module and the second differential amplification module, the first differential amplification module and the second differential amplification module are complementarily stacked, each of the first differential amplification module and the second differential amplification module comprises two cascode structures, and each cascode structure comprises K transistors stacked together; wherein K is a nature or equal to 2.

14. The power amplifier according to claim 13, wherein in the amplification circuit, a gate of each transistor other than main amplification transistors is connected to a gate capacitor, each gate capacitor has a first end and a second end, the second end of each gate capacitor whose first end is connected to a PMOS transistor is connected to a supply voltage, the second end of each gate capacitor whose first end is connected to an NMOS transistor is grounded.

15. The power amplifier according to claim 13, wherein a gate of each main amplification transistor in the amplification circuit is further connected to a corresponding input of the amplification circuit through an input capacitor.

* * * * *